United States Patent
Tai et al.

(10) Patent No.: US 8,466,010 B2
(45) Date of Patent: Jun. 18, 2013

(54) SEAL RING SUPPORT FOR BACKSIDE ILLUMINATED IMAGE SENSOR

(71) Applicant: Omnivision Technologies, Inc., Santa Clara, CA (US)

(72) Inventors: Hsin-Chih Tai, San Jose, CA (US); Vincent Venezia, Los Gatos, CA (US); Yin Qian, Milpitas, CA (US); Duli Mao, Sunnyvale, CA (US); Keh-Chiang Ku, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/735,787

(22) Filed: Jan. 7, 2013

(65) Prior Publication Data
US 2013/0122637 A1 May 16, 2013

Related U.S. Application Data

(62) Division of application No. 12/986,032, filed on Jan. 6, 2011, now Pat. No. 8,373,243.

(51) Int. Cl.
*H01L 23/04* (2006.01)

(52) U.S. Cl.
USPC ........... 438/121; 257/291; 257/447; 257/730; 257/E23.18; 438/106

(58) Field of Classification Search
USPC .......... 257/291, 447, 730, E31.124, E31.125; 438/73, 106, 121
See application file for complete search history.

(56) References Cited

U.S. PATENT DOCUMENTS

| | | | |
|---|---|---|---|
| 6,753,608 B2 | 6/2004 | Tomita | |
| 6,876,062 B2 | 4/2005 | Lee et al. | |
| 7,655,495 B2 | 2/2010 | Adkisson et al. | |
| 8,247,852 B2 | 8/2012 | Tai et al. | |
| 8,338,917 B2 * | 12/2012 | Yaung et al. | 257/620 |
| 2003/0122235 A1 * | 7/2003 | Tsai et al. | 257/678 |
| 2006/0043438 A1 | 3/2006 | Holm et al. | |
| 2006/0055005 A1 * | 3/2006 | Furusawa et al. | 257/635 |
| 2006/0163720 A1 * | 7/2006 | Hirata | 257/704 |
| 2007/0117253 A1 | 5/2007 | Hsu et al. | |
| 2009/0140365 A1 | 6/2009 | Lee et al. | |
| 2009/0140391 A1 | 6/2009 | Hou et al. | |
| 2009/0200587 A1 | 8/2009 | Venezia et al. | |
| 2010/0084735 A1 | 4/2010 | Yang | |
| 2011/0115002 A1 | 5/2011 | Tai et al. | |
| 2011/0217807 A1 | 9/2011 | Nagaraja et al. | |
| 2013/0082346 A1 * | 4/2013 | Lin et al. | 257/503 |

* cited by examiner

*Primary Examiner* — Allan R Wilson
(74) *Attorney, Agent, or Firm* — Blakely Sokoloff Taylor & Zafman LLP

(57) ABSTRACT

A backside illuminated imaging sensor with a seal ring support includes an epitaxial layer having an imaging array formed in a front side of the epitaxial layer. A metal stack is coupled to the front side of the epitaxial layer, wherein the metal stack includes a seal ring formed in an edge region of the imaging sensor. An opening is included that extends from the back side of the epitaxial layer to a metal pad of the seal ring to expose the metal pad. The seal ring support is disposed on the metal pad and within the opening to structurally support the seal ring.

10 Claims, 8 Drawing Sheets

SEAL RING SUPPORT FOR BACKSIDE ILLUMINATED IMAGE SENSOR

REFERENCE TO PRIOR APPLICATION(S)

This is a divisional of U.S. application Ser. No. 12/986,032, filed Jan. 6, 2011, now pending. U.S. application Ser. No. 12/986,032 is hereby incorporated by reference.

TECHNICAL FIELD

This disclosure relates generally to imaging sensors, and in particular but not exclusively, relates to backside illuminated ("BSI") imaging sensors.

BACKGROUND INFORMATION

A semiconductor chip, or die (such as an image sensor chip) is fabricated on a single semiconductor wafer, along with hundreds and in some cases thousands of copies of the same die. The cutting to separate a semiconductor wafer into individual dies can be done with a die saw (such as a diamond saw). Cuts are made along areas of non-functional semiconductor material separating each die known as scribe lines. Using a diamond saw introduces mechanical stress to the semiconductor wafer and can result in cracking at the die edge and compromising the integrity and reliability of the integrated circuit. One structure used to make a die less susceptible to the mechanical stress of die saws are seal rings. A seal ring in a die is formed in or on an outer region of one or more dielectric layers of a semiconductor substrate to protect the integrated circuit from contaminants (e.g. sodium) and make a die less susceptible to the mechanical stress caused by the die saw.

Many semiconductor imaging sensors today are front side illuminated. That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated imaging sensors are an alternative to front side illuminated imaging sensors that address the fill factor problems associated with front side illumination. Backside illuminated imaging sensors include imaging arrays that are fabricated on the front surface of the semiconductor wafer, but receive light through a back surface of the wafer. Color filters and micro-lenses may be included on the back surface of the wafer in order to improve the sensitivity of the backside illuminated sensor. However, to detect light from the backside, the wafer must be extremely thin. The thickness of the wafer may also be reduced in order to improve the sensitivity. However, the thinner the wafer, the more susceptible it becomes to physical damage during the various manufacturing stages. That is, as the semiconductor wafer is thinned, the weaker it becomes, making the backside illuminated imaging sensor wafer even more susceptible to the mechanical stress of die saws.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Sensor with Seal Ring Support Structure are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "down", "above", "below" are used with reference to the orientation of the figure(s) being described.

Figure 1A:
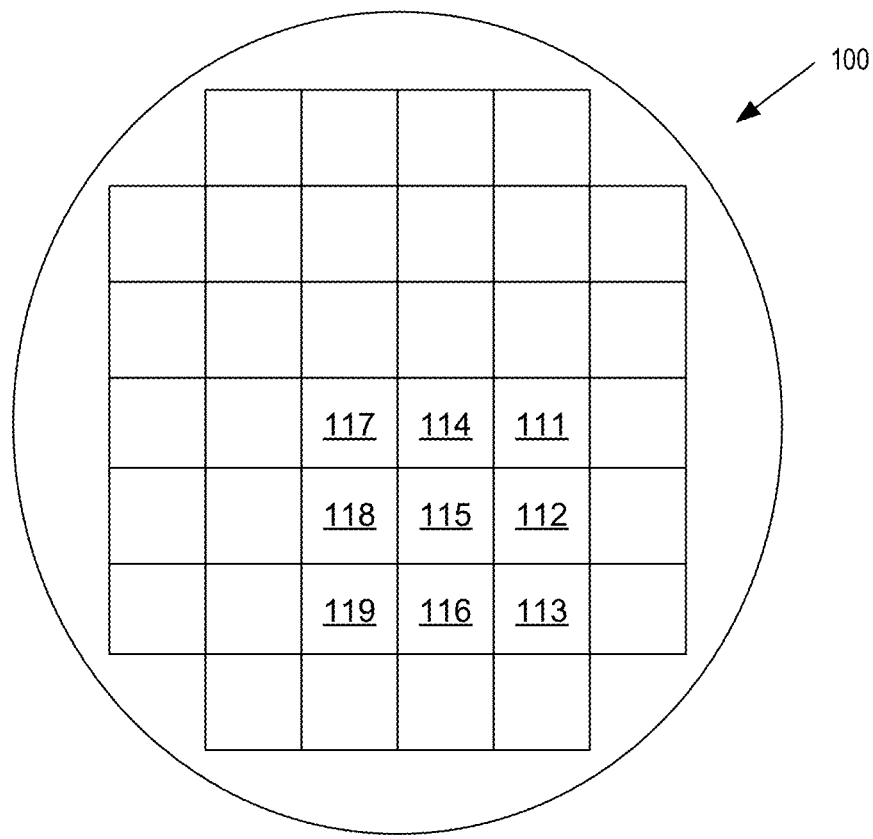
FIG. 1A is a diagram illustrating a semiconductor wafer with integrated circuit dies shown.
Figure 1B:
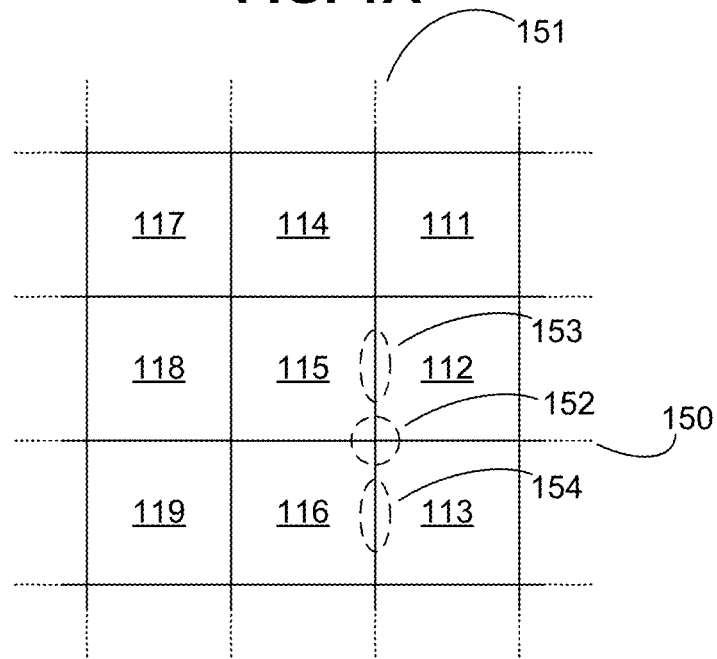
FIG. 1B is a diagram illustrating in greater detail the integrated circuit dies shown in FIG. 1A.

FIG. 1A is a diagram illustrating semiconductor wafer 100, which includes a number of dies 111 thru 119. Semiconductor wafer 100 may include silicon, or gallium arsenide or other semiconductor materials. FIG. 1B is a diagram illustrating in greater detail semiconductor wafer 100 and dies 111 thru 119. Scribe lines 150 and 151 separate adjacent dies. Scribe line region 152 shows an area where scribe lines 150 and 151 intersect. The die areas near scribe line region 152 is typically more susceptible to mechanical stress caused by die saws because the die saws run across semiconductor wafer 100 twice in these regions, once along scribe line 150 and another time along scribe line 151. This is in contrast to regions 153 and 154, where the die saws typically only pass through once.

Figure 2A:
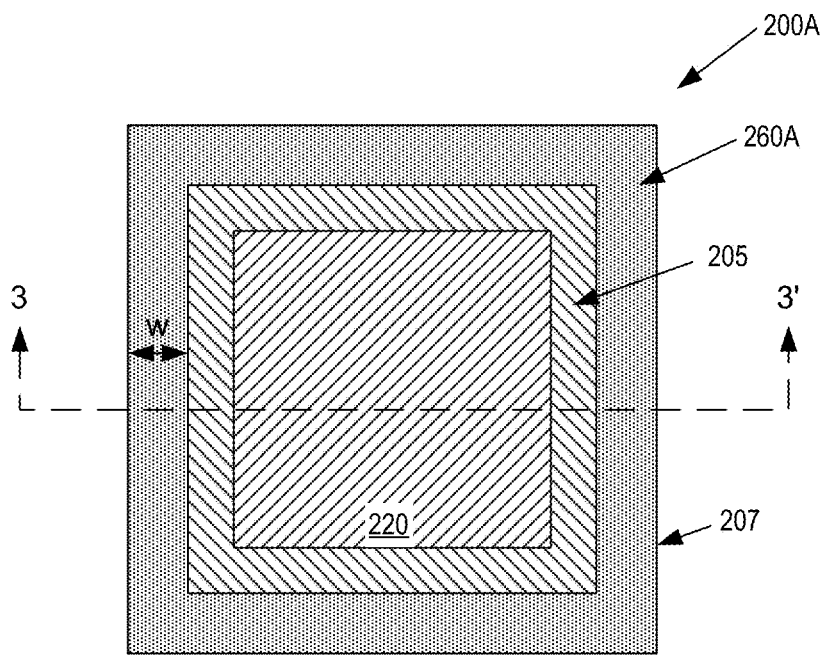
FIG. 2A is a plan view or bottom plan view of a backside illuminated image sensor with seal ring supports, in accordance with an embodiment of the invention

FIG. 2A is a plan view or bottom plan view of a backside illuminated image sensor 200 with seal ring support 260A in accordance to an embodiment of the invention. Seal ring support 260A is formed on the backside of seal ring which in turn is formed in or on an outer region 205 of image sensor 200 and surrounds integrated circuit region 220. In one embodiment, outer region 205 only includes non-functional semiconductor material. That is, outer region 205, in one example, may not include any integrated circuits, whereas integrated circuit region 220 may comprise one or more pixel arrays, readout circuitry, control circuitry and other functional logic. Also, outer region 205 may extend from integrated circuit region 220 all the way to an outer edge 207 of image sensor 200.

Seal rings may protect integrated circuit region 220 from contaminants (e.g. sodium) and may make metal interconnects and dielectric layers of semiconductor substrate of BSI image sensor 200 less susceptible to the mechanical stress caused by die saw or other processes employed to separate multiple dies formed on a semiconductor wafer into individual dies. In FIG. 2A seal ring support 260A has a width, w, and is disposed within the outer region 205 between integrated circuit region 220 and outer edge 207 of image sensor 200. In one embodiment, seal ring support 260A has a width such that the seal ring support 260A extends to the outer edge 207. Seal ring support 260A may include oxide, nitride or metal such as aluminum or tungsten or an alloy of other metals. Seal rings may have the same width as the width w of seal ring support 210, or the seal rings may have a width that is greater or less than w.

Figure 2B:
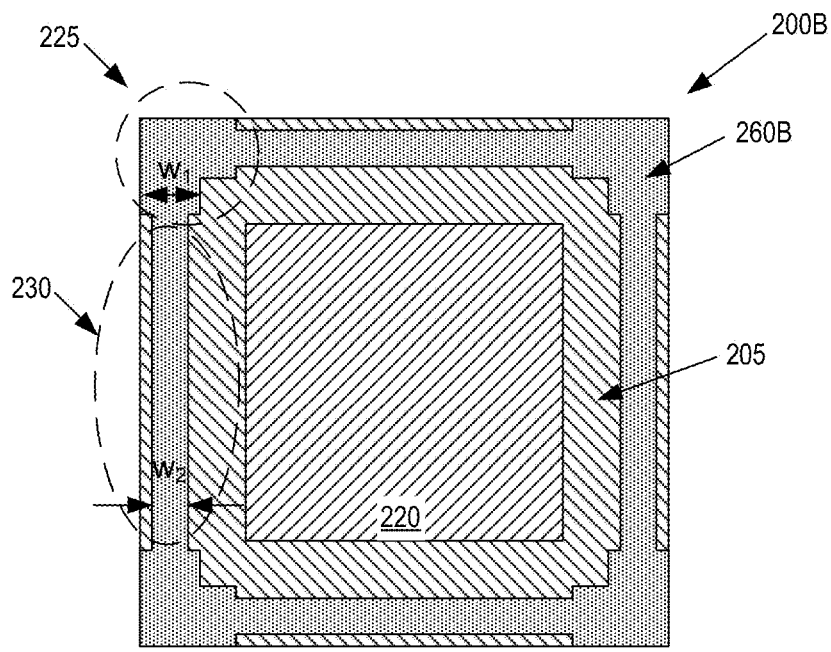
FIG. 2B is a plan view or bottom plan view of a backside illuminated image sensor with seal ring supports, in accordance with another embodiment of the invention.

FIG. 2B is a plan view or bottom plan view of a BSI image sensor 200 with seal ring support 260B in accordance to another embodiment of the invention. Seal ring support 260B has two widths $w_1$ and $w_2$. In the corner region 225 of BSI image sensor 200 around the corners, seal ring support 215 has a width $w_1$, which is greater than the width $w_2$ of seal ring support 215 along a side region 230 of BSI image sensor 200. In the illustrated embodiment of FIG. 2B, the greater width $w_2$ of seal ring support 260B in the corner regions 225 provide greater support to the seal rings at scribe line intersections (refer back to FIG. 1B, where the corners of dies 112, 113, 115 and 116 in regions such as scribe line intersection are more susceptible to the mechanical stress due to die saws than at scribe line regions 153 and 154.) Seal rings may have the same width as seal ring support 215 or the seal rings may have a width that is greater or less than $w_1$ and/or $w_2$.

Figure 3:
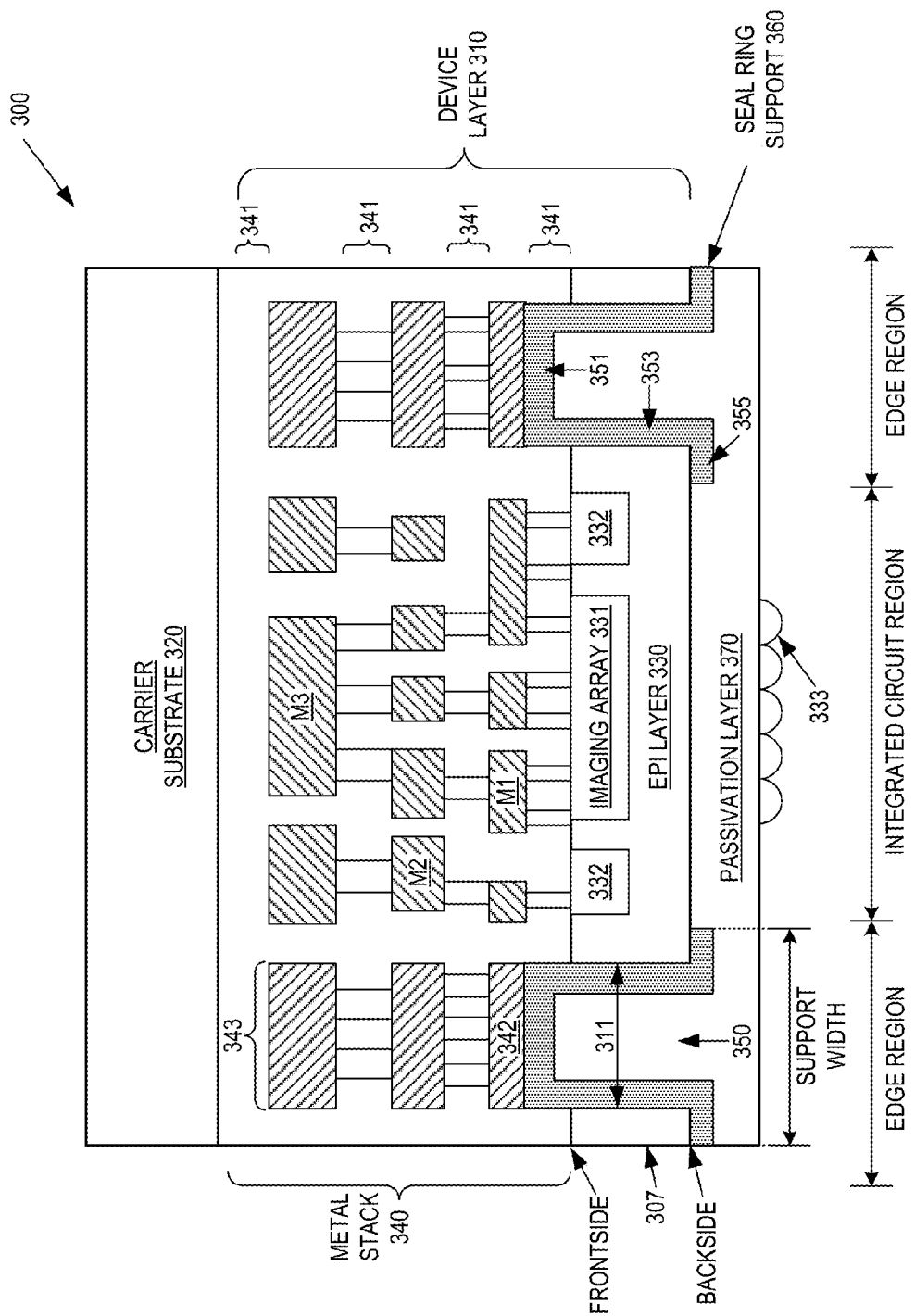
FIG. 3 is a cross-sectional view of a backside illuminate image sensor with seal ring supports, taken along section lines 3-3' of FIG. 2A, in accordance with an embodiment of the invention.

FIG. 3 is a cross-sectional view of BSI image sensor 300 with seal ring supports 360 taken along section lines 3-3' of FIG. 2A, in accordance with an embodiment of the invention. BSI image sensor 300 includes device layer 310 and carrier substrate 320. Device layer 310 includes epi layer 330 and metal stack 340. Components such as the photosensitive regions, source and drain regions of transistors are included in imaging array 331. Imaging array 331 and periphery circuitry 332 are disposed in epitaxial (epi) layer 330. Metal stack 340 is formed on the frontside of epi layer 330.

Dielectric layers 341 separate adjacent metal interconnect layers of metal stack 340 as well as the metal interconnect layers from epi layer 330 and carrier substrate 320. In the present embodiment, metal stack 340 includes three metal interconnect layers. In other embodiments of the invention, metal stack 340 may have more or less metal layers. In some embodiments, metal interconnect layers M1, M2 and M3 may comprise tungsten, aluminum, cooper, an aluminum-copper alloy or other alloys.

Imaging array 331 is formed in the frontside of epi layer 330 and is configured to receive light from the backside of epi layer 330, which may also be the backside of device layer 310. Imaging array 331 may include an array of imaging pixels arranged in a plurality of rows and columns. Periphery circuit 332 may include readout circuitry, function logic and control circuitry. Optionally included in BSI image sensor 300 are colour filters (not shown) to implement a colour imaging sensor and micro-lens 333 to focus light onto an array of imaging pixels in imaging array 331. Both the optional colour filters and micro-lens 333 may be disposed on the backside of device layer 310.

Carrier substrate 320 is coupled or bonded to the frontside of device layer 310 to provide structural support to BSI image sensor 300. It is noted that the illustrated embodiment of BSI image sensor 300 is not drawn to scale. That is, carrier substrate 320 may have a thickness that is much greater than that of device layer 310. For example, carrier substrate 320 may be on the order of 100 times thicker than device layer 310. In some embodiments, carrier substrate 320 is fabricated separately and then bonded to the frontside of device layer 310 by a method such as press-bonding.

Seal ring 343 is formed in an outer edge region of dielectric layers 341 surrounding the integrated circuit region that includes periphery circuitry 332 and imaging array 331. Metallization layers of seal ring 343 are connected by vias from lower metal M1 to upper metal M3. Opening 350 is formed by etching the backside of epi layer 330 through the entire depth of epi layer 330 and through dielectric layer 341 to expose metal pad 342 of metal interconnect M1. Opening 350 may have a width 311 of 3 to 50 μm and a depth of 0.5 to 5 μm. Seal ring support 360 may include oxide, nitride or metal such as aluminum or tungsten or an alloy of other metals and have a thickness of tens to a hundred nanometers. In one embodiment seal ring support 360 includes a metal where the seal ring support 360 and seal ring 343 serve and function as a signal bus for imaging sensor 300. For example, seal ring support 360 and seal ring 343 may function as a ground bus or as a power bus for imaging sensor 300. In the present embodiment, seal ring 343, like the metal interconnection layers, includes three metal layers, in other embodiments, seal ring 343 may comprise a fewer number of metal layers than the number metal interconnect layers.

As shown in FIG. 3, seal ring support 360 includes a first horizontal portion 351, a vertical portion 353, and a second horizontal portion 355. The support width of seal ring support 360 can be adjusted by adjusting the width 311 of opening 311 and/or by masking more or less of second horizontal portion 355 on the backside of epi layer 330. For example, seal ring support 360 may be formed by masking a support material such that seal ring support 360 extends on backside of epi layer 330 to an outer edge 307. Passivation layer 370 provides planarization on the backside of device layer 310. Microlens 333 are formed on the backside of passivation layer 370.

Figure 4:
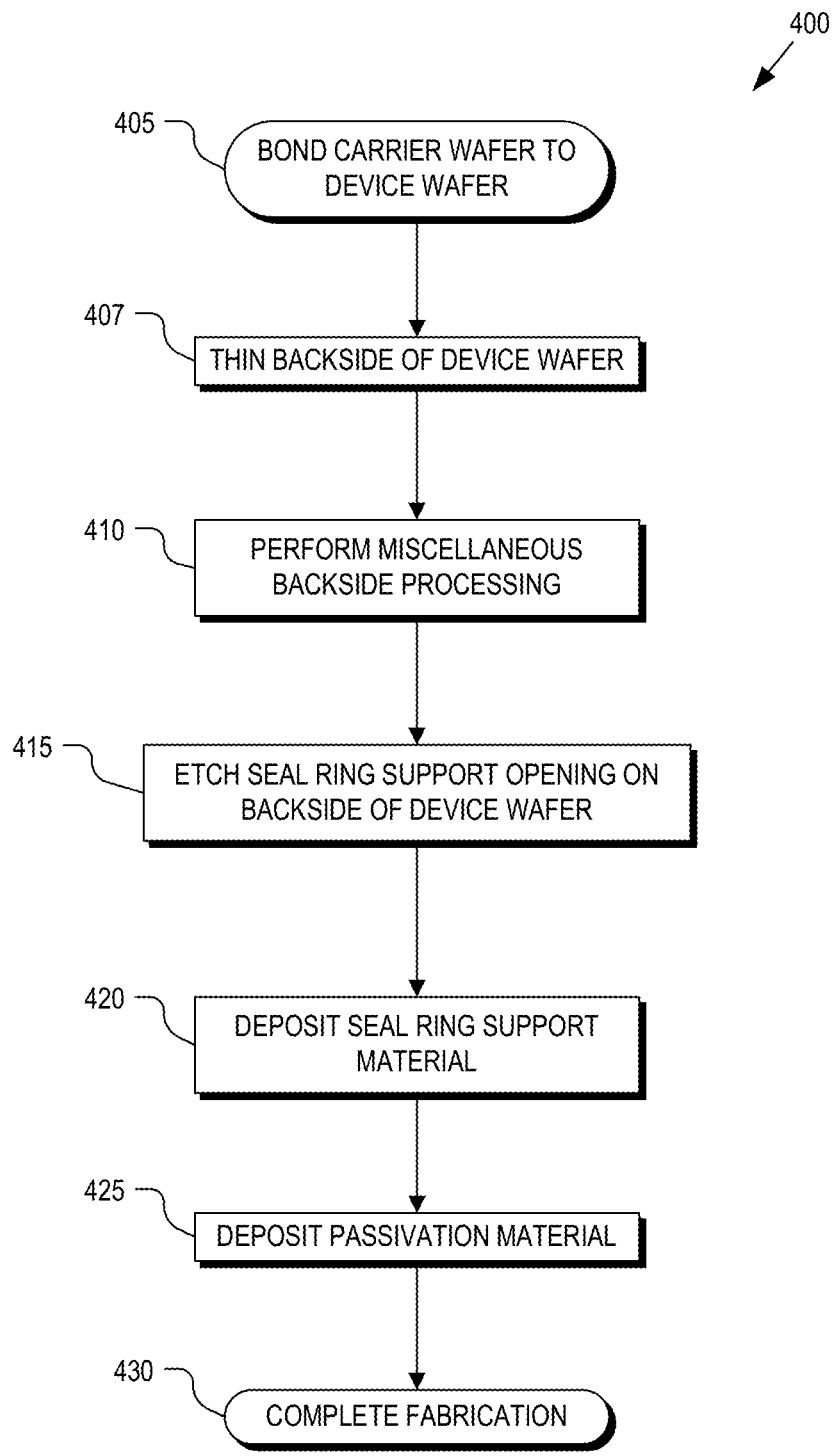
FIG. 4 is a flow chart illustrating a method of fabricating a backside illuminated imaging sensor with seal ring supports, in accordance with an embodiment of the invention.

FIG. 4 is a flow chart illustrating an embodiment of process 400 for fabricating a BSI image sensor wafer 500 with seal ring support 560 (see FIGS. 5A-5D). The order in which some or all of the process blocks appear in each process should not be deemed limiting. Rather, one of ordinary skill in the art and having the benefit of the present disclosure will understand that some of the process blocks may be executed in a variety of orders not illustrated.

Figure 5A:
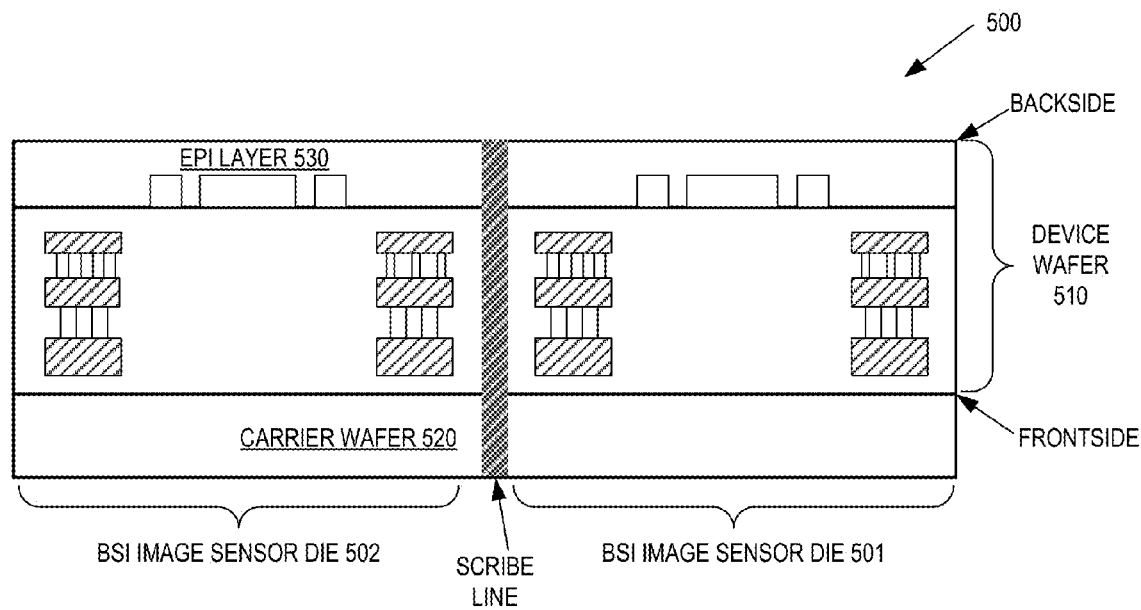
FIG. 5A is a cross-sectional view illustrating an embodiment of a partially fabricated backside illuminated image sensor wafer.

In process block 405, carrier wafer 520 is wafer bonded to the frontside of device wafer 510 to provide structural support to the imaging sensor before thinning the backside of device wafer 510 as seen in FIG. 5A. In one embodiment, carrier wafer 520 is bonded to device wafer 510 by a method such as press-bonding. Backside of device wafer 510 or epi layer 530 is then thinned in a process block 407. Epi layer 530 may be thinned to a thickness in the range of approximately 1 μm to approximately 10 μm.

Figure 5B:
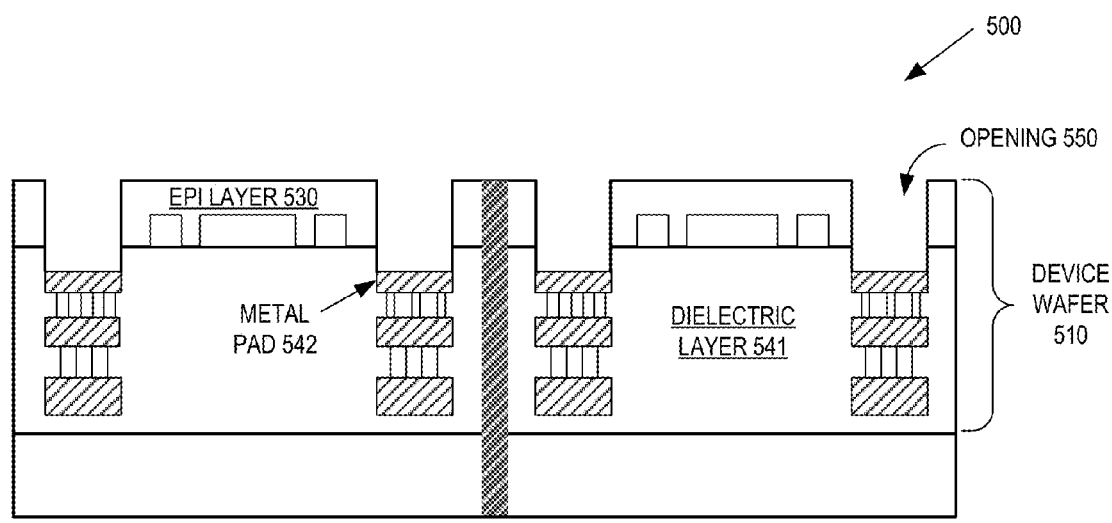
FIG. 5B is a cross-sectional view illustrating an embodiment of a partially fabricated backside illuminated image sensor wafer with seal ring support opening formed.
Figure 5C:
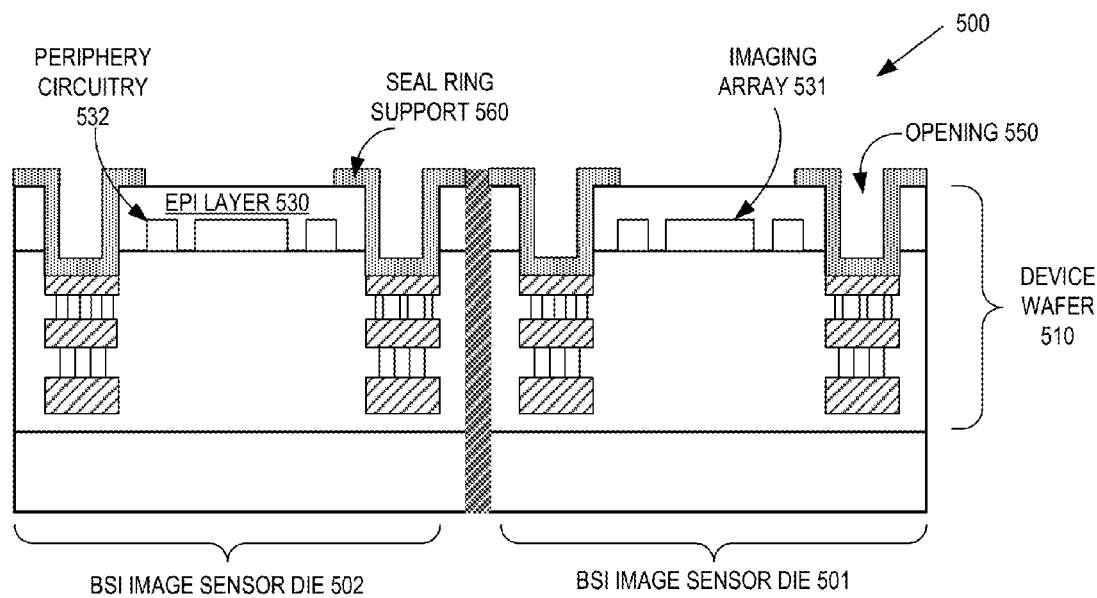
FIG. 5C is a cross-sectional view illustrating an embodiment of a partially fabricated backside illuminate image sensor wafer after the deposition of a seal ring support material lining the seal ring support opening.

In process block 410 any miscellaneous backside processing may be performed. For example, any backside implantations or anneals may be performed in process block 410. In process block 415 seal ring support openings 550 are etched thru the backside of epi layer 530 down into dielectric layer 541 to expose metal pad 542 of metal interconnect layer M1, as seen in FIG. 5B. Seal ring support opening 550 may have a width of 3 to 50 μm and a depth of 0.5 to 5 μm. In process block 420 seal ring support material is deposited to the backside of epi layer 530, and etched off in regions where it is not wanted. These regions include at least the region of the backside of device wafer 510 directly above imaging array 531 of each BSI image sensor die 501 and 502. In some embodiments seal ring support 560 may be etched off the region of the backside of device wafer 510 directly above periphery circuitry 532. Seal ring support 560 may comprise oxide, nitride or metal such as aluminum or tungsten or an alloy of other metals. Seal ring support 560 may have a thickness of tens to a hundred nanometers.

Figure 5D:
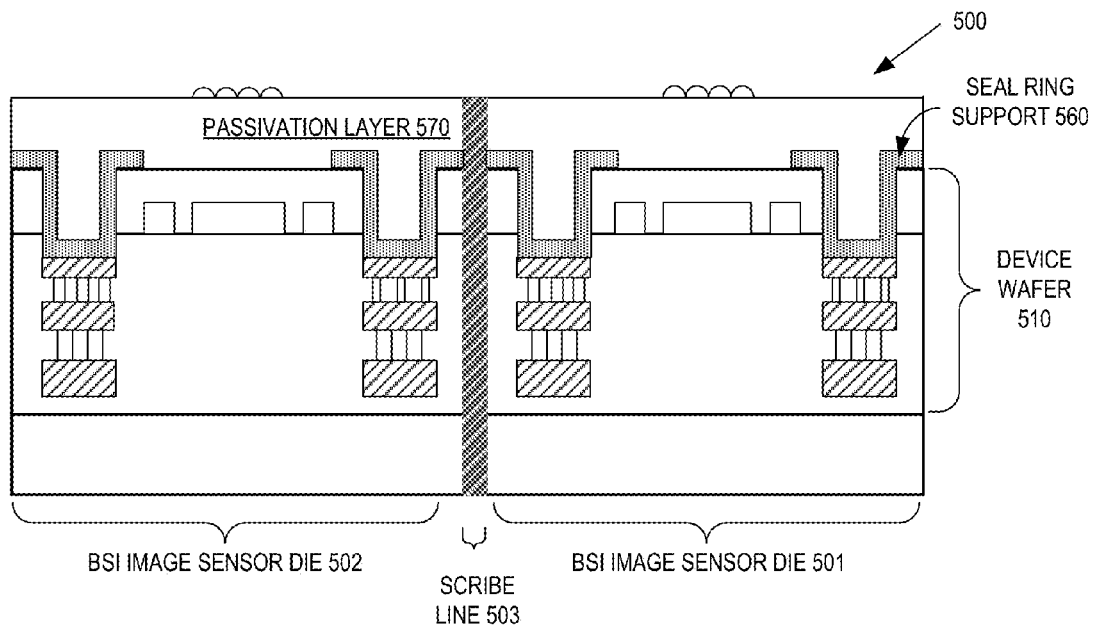
FIG. 5D is a cross-sectional view illustrating an embodiment of a partially fabricated backside illuminated image sensor wafer after the deposition of a passivation material.

In process block 425 passivation material 580 is deposited on the backside of device wafer 510 to provide planarization, as seen in FIG. 5D. In process block 435, the fabrication of BSI image sensor dies 501 and 502 are completed with steps such as formation of micro-lens 533 and die saw along scribe line 503 to separate the dies from the semiconductor wafer.

Figure 6:
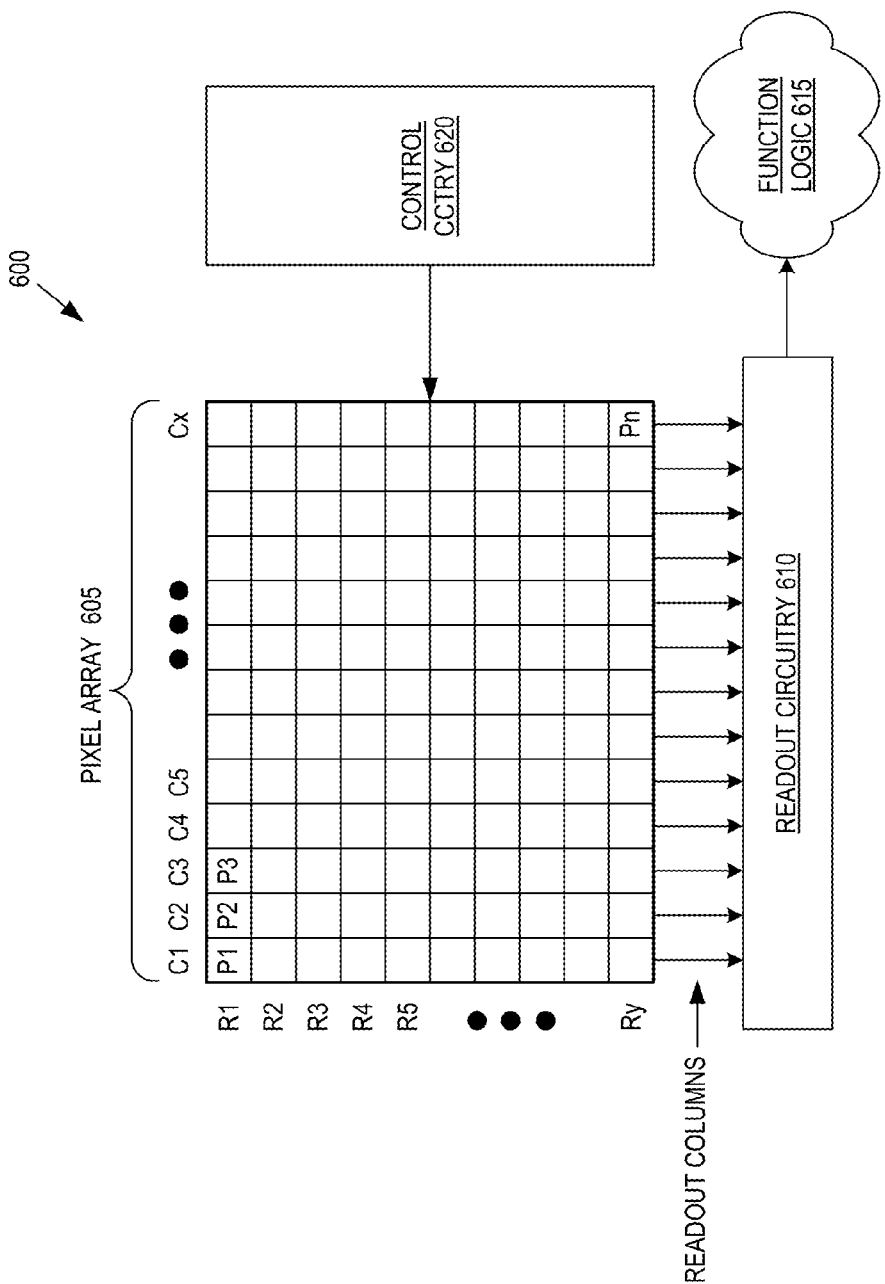
FIG. 6 is a block diagram illustrating an embodiment of a BSI image sensor die.

FIG. 6 is a block diagram illustrating a backside illuminated imaging sensor 600, in accordance with an embodiment of the invention. The illustrated embodiment of imaging sensor 600 includes a imaging array 605, readout circuitry 610, function logic 615, and control circuitry 620.

Imaging array 605 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 610 and transferred to function logic 615. Readout circuitry 610 can include amplification circuitry, analog-to-digital ("ADC") conversion circuitry, or otherwise. Function logic 615 can simply store the image data or even manipulate the image data by applying post image effects (e.g., crop, rotate, remove red eye, adjust brightness, adjust contrast, or otherwise). Control circuitry 620 is coupled to pixel array 605 to control operational characteristic of pixel array 605.

Figure 7:
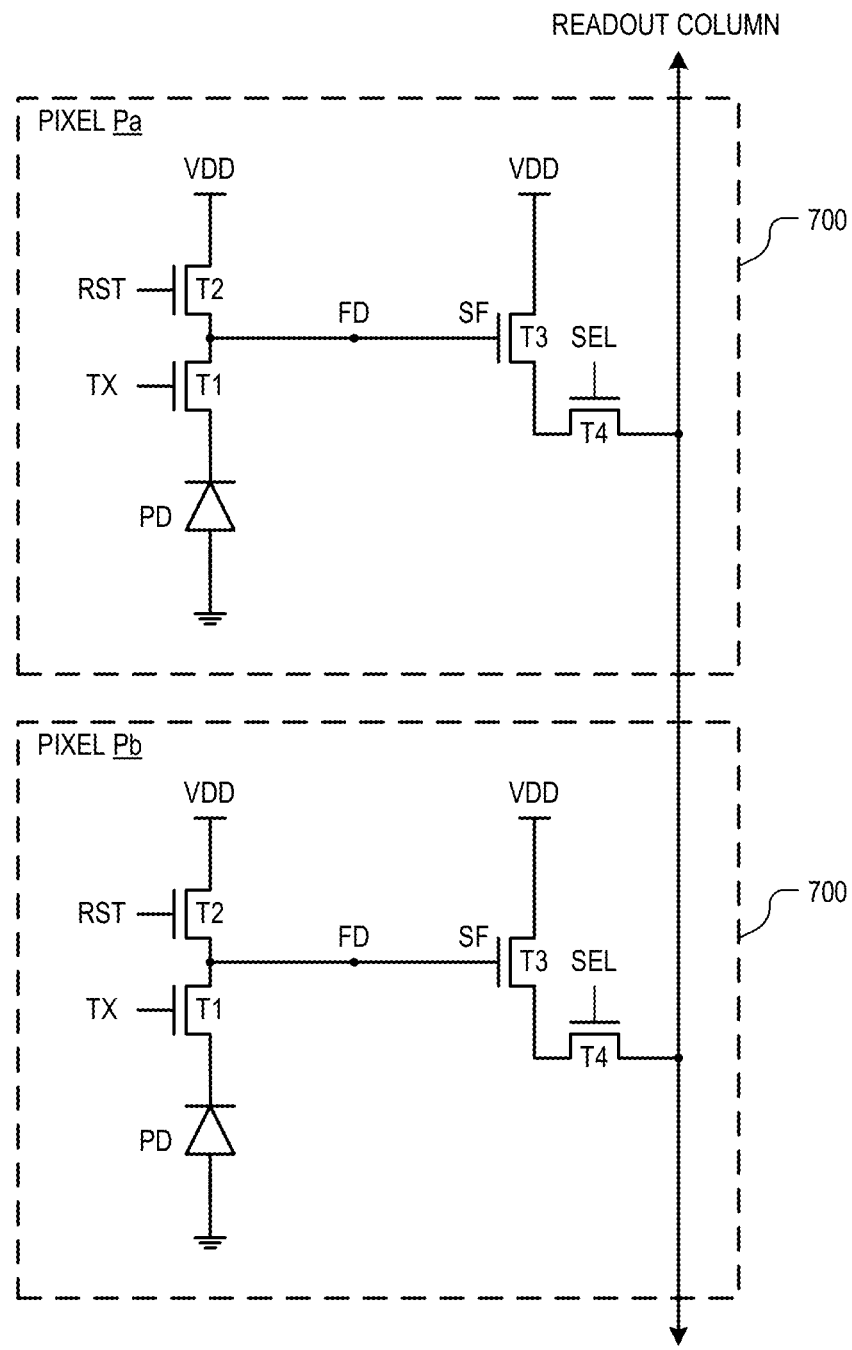
FIG. 7 is a circuit diagram illustrating pixel circuitry of two four-transistor ("4T") pixels within an embodiment of a BSI imaging array.

FIG. 7 is a circuit diagram illustrating an embodiment of pixel circuitry 700 of two four-transistor ("4T") pixels within a BSI imaging array, in accordance with an embodiment of the invention. Pixel circuitry 700 is one possible pixel circuitry architecture for implementing each pixel within pixel array 605 of FIG. 6, but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 7, BSI pixels Pa and Pb are arranged in two rows and one column. The illustrated embodiment of each pixel circuitry 700 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD can be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 800 to the readout column line under control of a select signal SEL. In one embodiment, the TX signal, the RST signal, and the SEL signal are generated by control circuitry 520.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating a backside illuminated imaging sensor, the method comprising:
providing a backside illuminated imaging sensor, the imaging sensor including:
an epitaxial layer having an imaging array formed in a front side of the epitaxial layer, wherein the imaging array is adapted to receive light from a back side of the epitaxial layer;
a metal stack coupled to the front side of the epitaxial layer, wherein the metal stack includes a seal ring formed in an edge region of the imaging sensor;
etching an opening extending from the back side of the epitaxial layer to a metal pad of the seal ring to expose the metal pad;
depositing material on the back side of the epitaxial layer and within the opening; and
etching the material to form a seal ring support on the metal pad and within the opening to structurally support the seal ring, wherein the seal ring support has a first width in a corner region of the backside illuminated imaging sensor and a second width different from the first width in a side region of the backside illuminated imaging sensor.

2. The method of claim 1, wherein etching the material to form the seal ring support includes removing the material from a region of the back side of the epitaxial layer directly above the imaging array.

3. The method of claim 1, further comprising masking the material before etching the material.

4. The method of claim 1, wherein depositing the material comprises depositing a metal, a nitride or an oxide on the back side of the epitaxial layer.

5. The method of claim 1, further comprising depositing a planarization layer on the back side of the epitaxial layer and the seal ring support.

6. The method of claim 1, further comprising separating the backside illuminated imaging sensor from an adjacent backside illuminated imaging sensor along a scribe line after forming the seal ring support.

7. The method of claim 1, wherein the first width is greater than the second width.

8. The method of claim 1, wherein at least one of the first width and the second width is greater than a width of the opening.

9. The method of claim 1, wherein the opening has a third width in a corner region of the backside illuminated imaging sensor and a fourth width different from the third width in a side region of the backside illuminated imaging sensor.

10. The method of claim 9, wherein the third width is greater than the fourth width.

\* \* \* \* \*